(12) United States Patent  
Kim et al.

(10) Patent No.: US 8,519,544 B2
(45) Date of Patent: Aug. 27, 2013

(54) SEMICONDUCTOR DEVICE AND METHOD OF FORMING WLCSP STRUCTURE USING PROTRUDED MLP

(75) Inventors: OhHan Kim, Kyonggi-do (KR); SungWon Cho, Kyoung-gi-Do (KR); DaeSik Choi, Seoul (KR); KyuWon Lee, Kyoungki-Do (KR); DongSoo Moo, Kyonggi-do (KR)

(73) Assignee: STATS Chip PAC, Ltd., Singapore (SG)

( * ) Notice: Subject to any disclaimer, the term of this patent is extended or adjusted under 35 U.S.C. 154(b) by 0 days.

(21) Appl. No.: 13/570,979

(22) Filed: Aug. 9, 2012

(65) Prior Publication Data

US 2012/0306097 A1 Dec. 6, 2012

Related U.S. Application Data

(62) Division of application No. 13/032,536, filed on Feb. 22, 2011, now Pat. No. 8,273,604.

(51) Int. Cl.
*H01L 23/48* (2006.01)

(52) U.S. Cl.
USPC .......................................... 257/774; 257/788

(58) Field of Classification Search
USPC ............................ 438/106–127; 257/788, 774
See application file for complete search history.

(56) References Cited

U.S. PATENT DOCUMENTS

| 5,091,339 | A * | 2/1992 | Carey ............................... 216/18 |
| 7,190,080 | B1 | 3/2007 | Leu et al. |
| 7,262,082 | B1 | 8/2007 | Lin et al. |
| 7,528,009 | B2 * | 5/2009 | Chen et al. .................... 438/106 |
| 7,704,796 | B2 | 4/2010 | Pagaila et al. |
| 7,888,181 | B2 | 2/2011 | Camacho et al. |
| 8,097,490 | B1 | 1/2012 | Pagaila et al. |
| 8,101,460 | B2 | 1/2012 | Pagaila et al. |
| 2009/0243045 | A1 | 10/2009 | Pagaila et al. |
| 2010/0072599 | A1 | 3/2010 | Camacho et al. |

* cited by examiner

*Primary Examiner* — Richard Booth
(74) *Attorney, Agent, or Firm* — Robert D. Atkins; Patent Law Group: Atkins & Associates, P.C.

(57) ABSTRACT

A semiconductor device can include a carrier substrate, and a first semiconductor die disposed on a surface of the carrier substrate. An encapsulant can be disposed over the first semiconductor die and the carrier substrate. The semiconductor device can include first vias disposed through the encapsulant as well as second vias disposed through the encapsulant to expose first contact pads. The first contact pads are on upper surfaces of the first semiconductor die. The semiconductor device can include conductive pillars that fill the first vias, and first conductive metal vias (CMVs) that fill the second vias. The conductive pillar can include a first conductive material, and the first CMVs can be in contact with the first contact pads. The semiconductor device can include a conductive layer disposed over the encapsulant. The conductive layer can electrically connect one of the first CMVs with one of the conductive pillars.

25 Claims, 17 Drawing Sheets

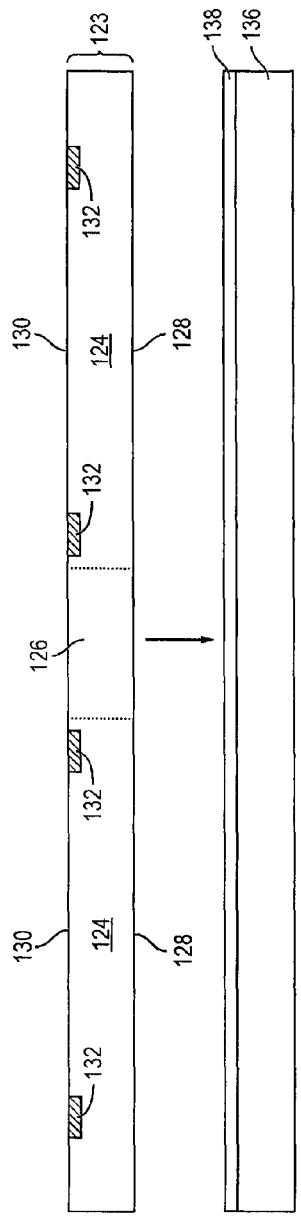
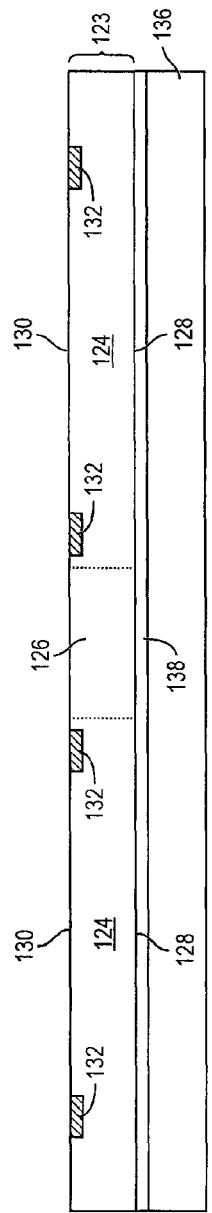
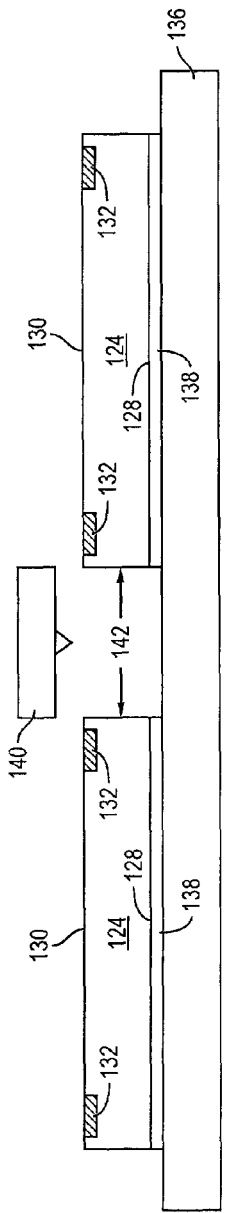
FIG. 4a
FIG. 4b
FIG. 4c

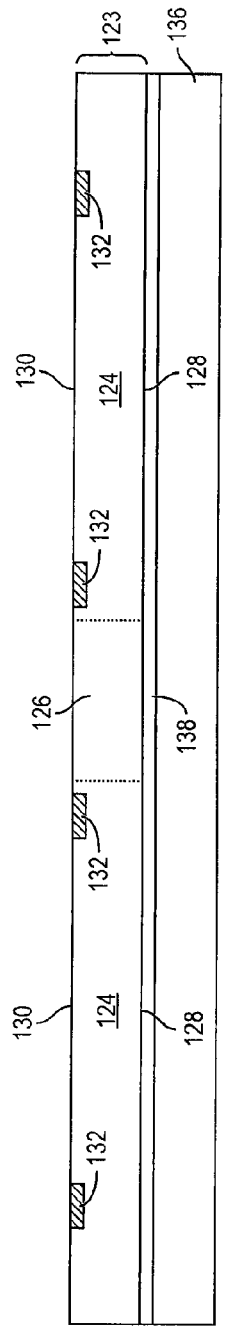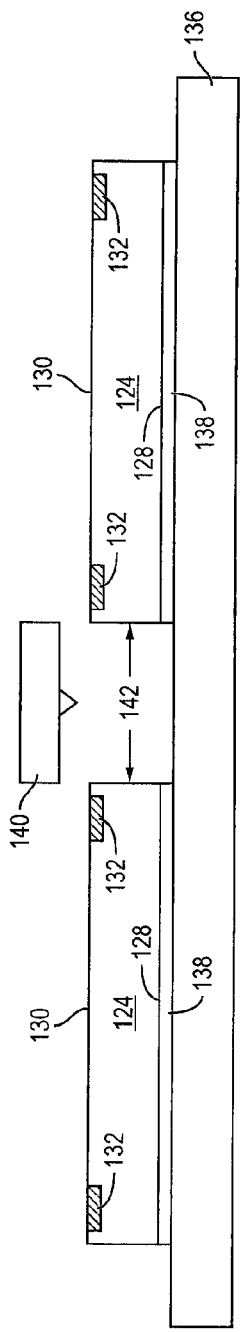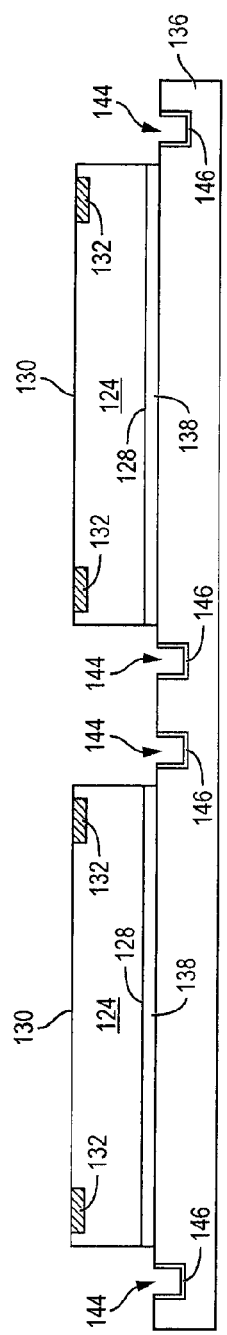
FIG. 7a
FIG. 7b
FIG. 7c

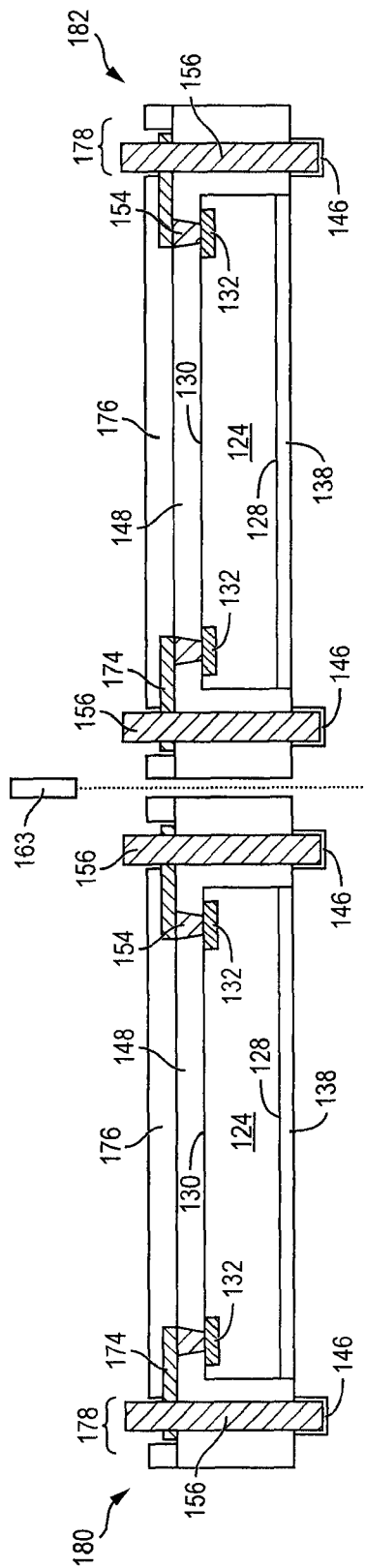
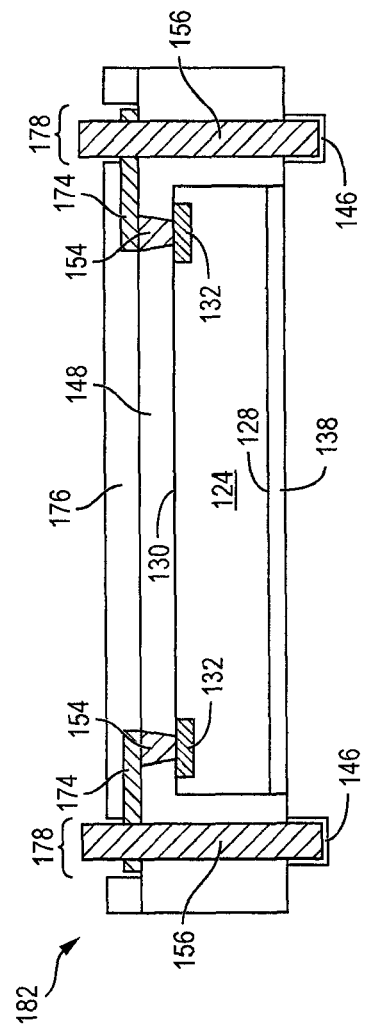
FIG. 7j
FIG. 8

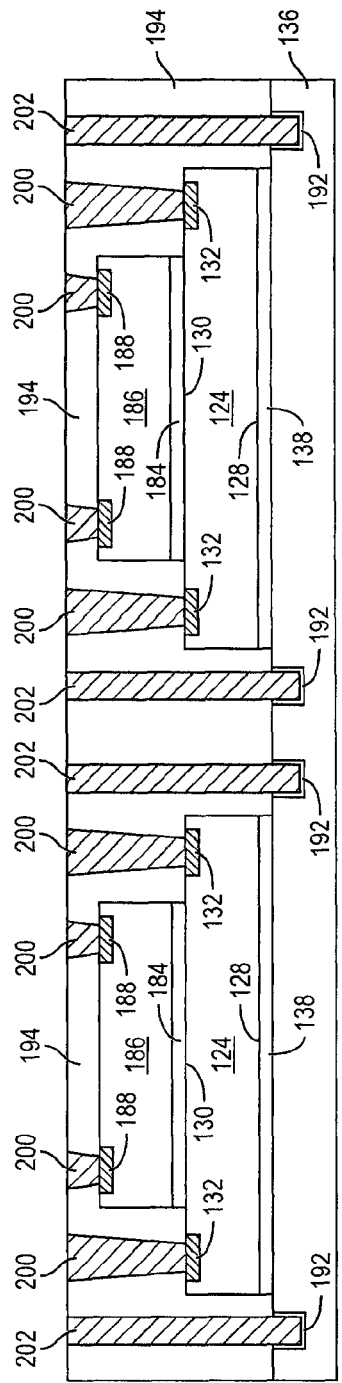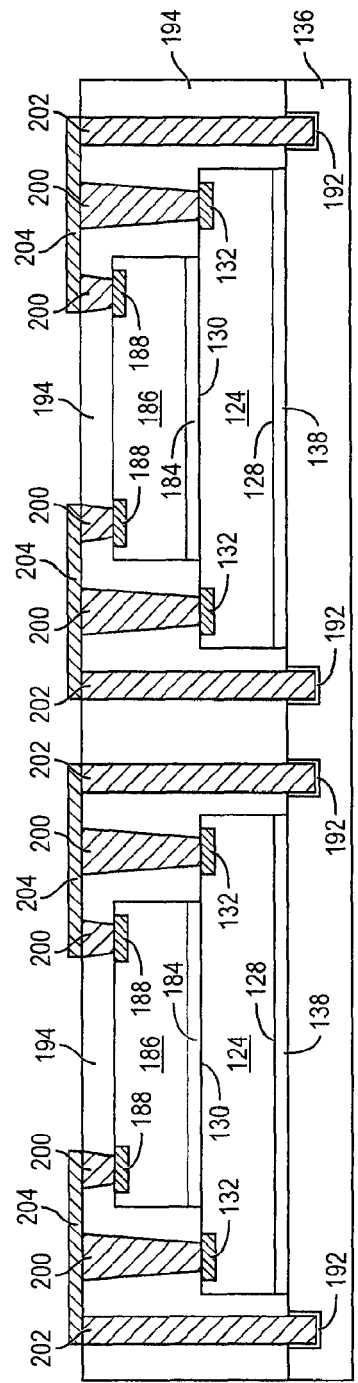
FIG. 9g
FIG. 9h

US 8,519,544 B2

SEMICONDUCTOR DEVICE AND METHOD OF FORMING WLCSP STRUCTURE USING PROTRUDED MLP

CLAIM TO DOMESTIC PRIORITY

The present application is a division of U.S. patent application Ser. No. 13/032,536, filed Feb. 22, 2011, which application is incorporated herein by reference.

FIELD OF THE INVENTION

The present invention relates in general to semiconductor devices and, more particularly, to Molded Laser Packages (MLPs) having protruded conductive pillars and methods of fabricating the same.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Most if not all wafer level chip scale packages (WLCSP) require a z-direction electrical interconnect structure for signal routing and package integration. Conventional WLCSP z-direction electrical interconnect structures exhibit one or more limitations. In one example, a conventional WLCSP contains a flipchip type semiconductor die and encapsulant formed over the die. An interconnect structure is typically formed over, around, and through the semiconductor die and encapsulant for z-direction vertical electrical interconnect. The flipchip semiconductor die is electrically connected to the interconnect structure with bumps. The encapsulant and bump interconnect makes package stacking difficult to achieve with fine pitch or high input/output (I/O) count electrical interconnect. In addition, wire bond type semiconductor die are also difficult to stack without dramatically increasing package height.

SUMMARY OF THE INVENTION

A need exists for a simple and cost effective WLCSP interconnect structure for applications requiring a fine interconnect pitch and vertical package integration. Accordingly, in one embodiment, the present invention is a semiconductor device comprising a substrate and first semiconductor die disposed over the substrate. An encapsulant is deposited over the substrate and over a surface of the first semiconductor die. A first conductive via is formed through the encapsulant and extending beyond a first surface of the encapsulant into the substrate. A second conductive via is formed through the encapsulant over the first semiconductor die. A conductive layer is formed over the encapsulant between the first conductive via and second conductive via.

In another embodiment, the present invention is a semiconductor device comprising a first semiconductor die and encapsulant deposited around the first semiconductor die and over a surface of the first semiconductor die. A first conductive via is formed through the encapsulant and extending beyond a first surface of the encapsulant. A second conductive via is formed through the encapsulant over the first semiconductor die.

In another embodiment, the present invention is a semiconductor device comprising a first semiconductor die and encapsulant deposited over the first semiconductor die. A first conductive via is formed through the encapsulant and extending beyond a first surface of the encapsulant. A conductive layer is formed over the encapsulant and electrically connected to the first conductive via. An insulating layer is formed over the conductive layer and encapsulant. A portion of the insulating layer is removed to expose the conductive layer.

In another embodiment, the present invention is a semiconductor device comprising a first semiconductor die and encapsulant deposited around the first semiconductor die and over a surface of the first semiconductor die. A first conductive via is formed through the encapsulant and extending beyond a first surface of the encapsulant.

BRIEF DESCRIPTION OF THE DRAWINGS

FIGS. 4a-4j illustrate processes for fabricating a MLP having protruded conductive pillars;

FIGS. 7a-7j illustrate processes for fabricating another MLP having protruded conductive pillars;

FIG. 8 illustrates a single protruded MLP fabricated by the processes illustrated in FIGS. 7a-7j;

FIG. 9a-9j illustrate processes for fabricating still another MLP having protruded conductive pillars;

DETAILED DESCRIPTION OF THE DRAWINGS

Figure 1:
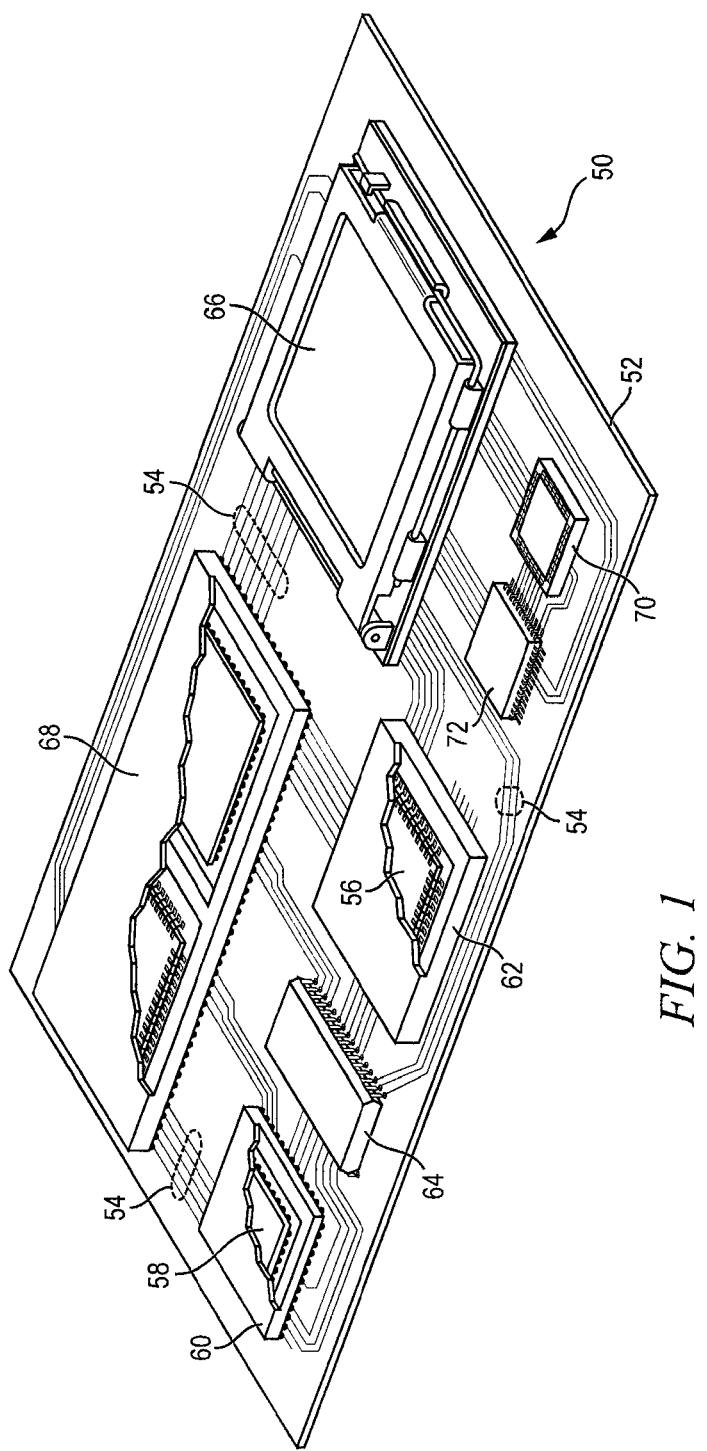
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
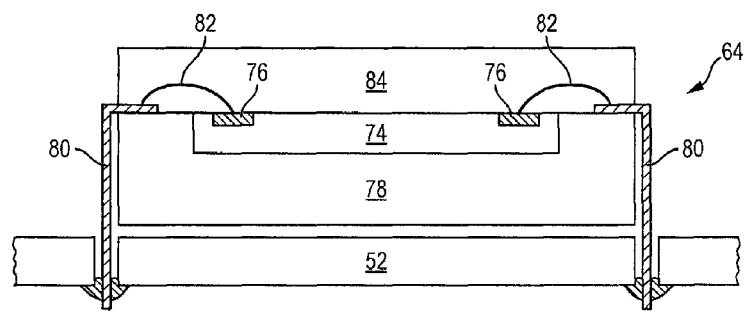
FIGS. 2a-2c illustrate further detail of the representative semiconductor packages mounted to the PCB.
Figure 2B:
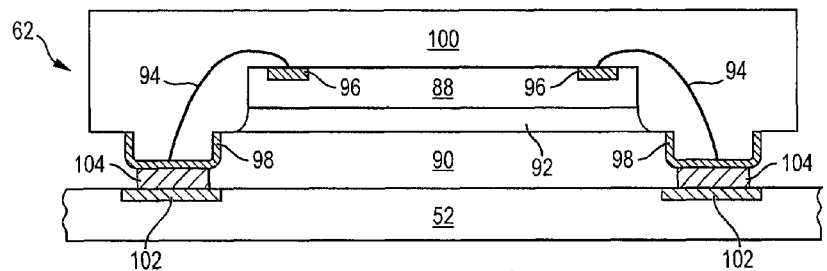
Figure 2C:
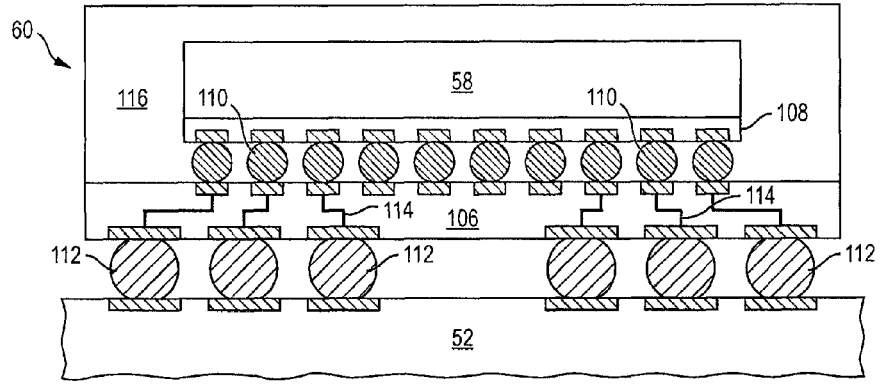

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
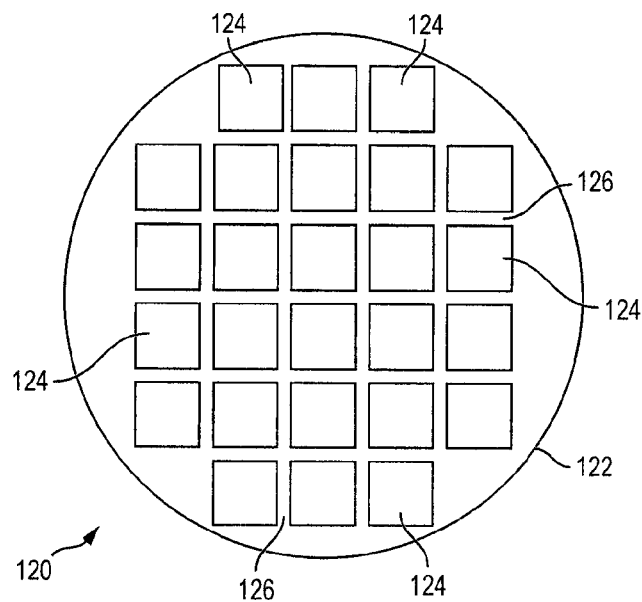
FIGS. 3a-3b illustrate a semiconductor wafer having semiconductor die.
Figure 3B:
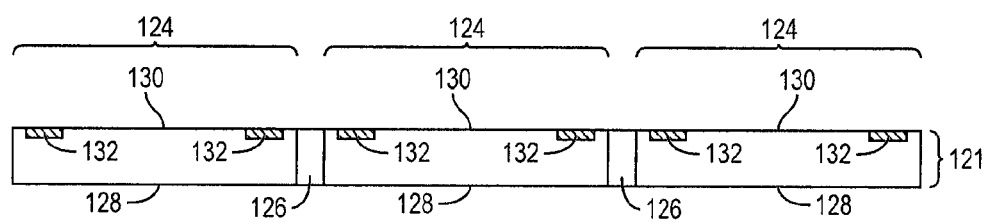

FIGS. 3a-3b illustrate a semiconductor wafer having semiconductor die. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

FIG. 3b shows a cross-sectional view of a portion 121 of semiconductor wafer 120, where portion 121 includes three semiconductor die 124. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 4D:
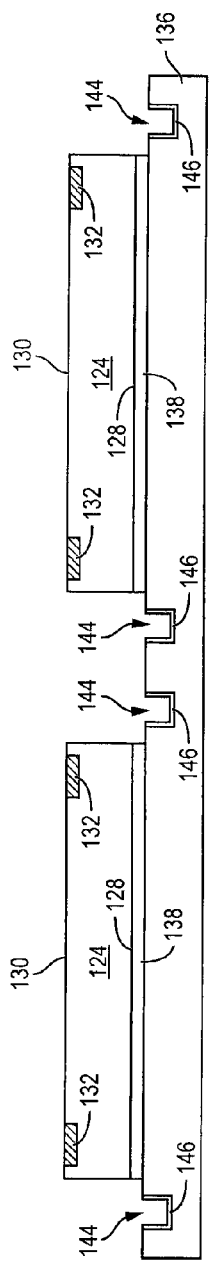

FIGS. 4a-4j illustrate, in relation to FIGS. 1 and 2a-2c, processes for making an MLP having protruded conductive pillars. FIG. 4a illustrates a portion 123 of semiconductor wafer 120 from FIG. 3a, where portion 123 includes two semiconductor die 124 having an active surface 130. A wafer-form substrate or carrier 136 contains temporary or sacrificial base material such as silicon, polymer, beryllium oxide, or other suitable low-cost, rigid material for structural support. An interface layer or double-sided tape 138 is formed over carrier 136 as a temporary adhesive bonding film or etch-stop layer. Portion 123 of semiconductor wafer 120 from FIG. 3a is mounted back surface 128 to carrier 136 and interface layer 138, resulting in the structure shown in FIG. 4b.

In FIG. 4c, portion 123 of semiconductor wafer 120 from FIG. 3a is singulated through saw street 126 using a saw blade or laser cutting tool 140 to form channel 142 and to separate the wafer portion 123 into individual semiconductor die 124 which remain affixed to carrier 136 and interface layer 138. Channel 142 has sufficient width to contain multiple later-formed conductive pillars.

In FIG. 4d, a plurality of vias or holes 144 is formed partially through selected locations on the carrier 136 using laser drilling, mechanical drilling, or deep reactive ion etching (DRIE). Next, a seed layer 146 is conformally deposited on surfaces of carrier 136 that are exposed by vias or holes 144. Seed layer 146 can be formed using an epitaxial growth, electrolytic plating, electroless plating, or another suitable metal deposition process. Seed layer 146 includes a conductive material such as Al, Cu, Sn, Ni, Au, Ag, titanium (Ti), tungsten (W), poly-silicon, or other suitable electrically conductive material.

Figure 4E:
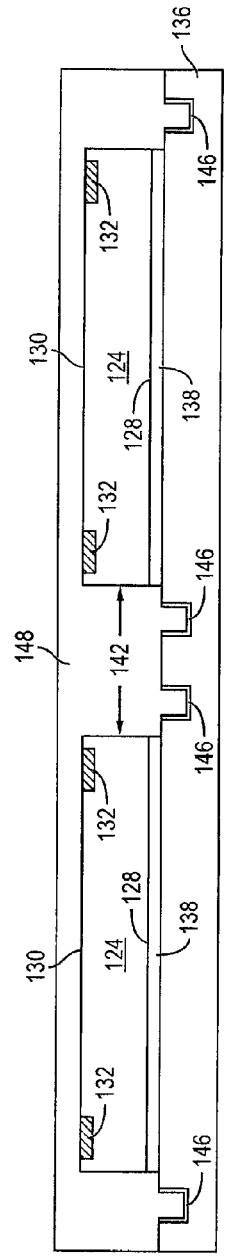

In FIG. 4e, an encapsulant or molding compound 148 is formed around semiconductor die 124, in channel 142 between semiconductor die 124, and in vias or holes 144 using a paste printing, compressive molding, transfer molding, liquid encapsulant molding, vacuum lamination, spin coating, or other suitable applicator. Encapsulant 148 can be polymer composite material, such as epoxy resin with filler, epoxy acrylate with filler, or polymer with proper filler. Encapsulant 148 is non-conductive and environmentally protects semiconductor die 124 from external elements and contaminants.

Figure 4F:
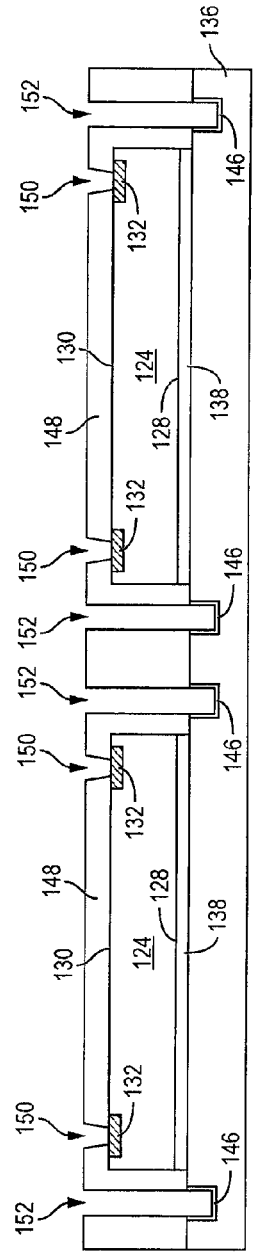

In FIG. 4f, after encapsulant 148 is cured, a plurality of vias or holes 150 is formed through the encapsulant down to contact pads 132 using laser drilling, mechanical drilling, or DRIE. Vias 150 can also be formed with a positive encapsulant-blocking via structure in the mold chase. Likewise, a plurality of vias or holes 152 is also formed through the encapsulant 148 down to seed layer 146 using laser drilling, mechanical drilling, or DRIE. Vias 152 can also be formed with a positive encapsulant-blocking via structure in the mold chase.

Figure 4G:
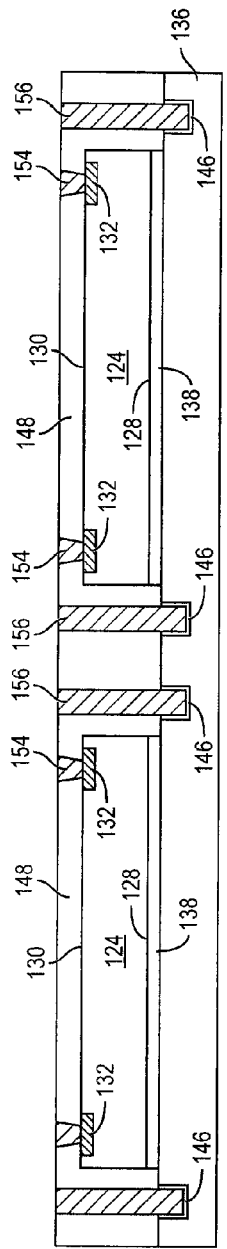

In FIG. 4g, vias 150 and 152 are filled with Al, Cu, Sn, Ni, Au, Ag, Ti, W, poly-silicon, or other suitable electrically conductive material. Vias 150 and 152 can be filled using an electrolytic plating, an electroless plating, a screen printing, a sputtering, or some other suitable metal deposition process. Vias 150 and 152 are filled with electrically conductive material to form z-direction vertical interconnect conductive mold vias (CMVs) 154 that are disposed on contact pads 132 and conductive pillars 156 that are disposed on seed layer 146.

Figure 4H:
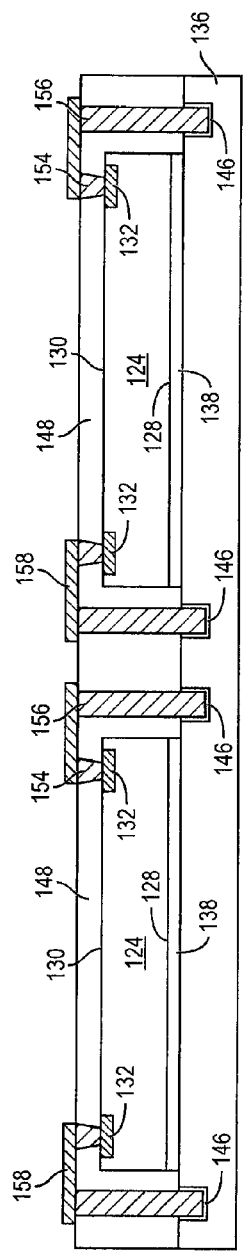

In FIG. 4h, an electrically conductive layer 158 is formed over encapsulant 148, over CMVs 154, and over conductive pillars 156, between CMVs 154 and conductive pillars 156. The conductive layer 158 is formed using a patterning and metal deposition process such as a printing, PVD, CVD, sputtering, electrolytic plating, or electroless plating process. Conductive layer 158 can include one or more layers of Al, Cu, Sn, Ni, Au, Ag, or other suitable electrically conductive material. Conductive layer 158 electrically connects CMVs 154 to conductive pillars 156.

Figure 4I:
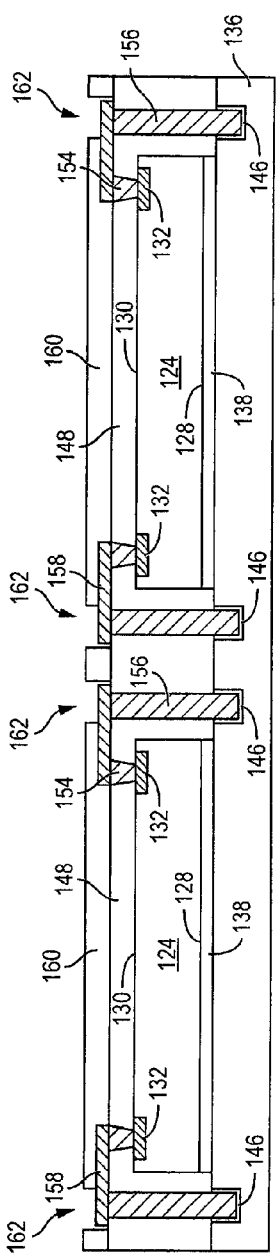

In FIG. 4i, an insulating or passivation layer 160 is formed over encapsulant 148, conductive layer 158, CMVs 154, and conductive pillars 156 using a PVD, CVD, printing, spin coating, spray coating, sintering, or thermal oxidation process. Insulating layer 160 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 160 is removed by an etching process to form vias or holes 162 that expose conductive layer 158.

Figure 4J:
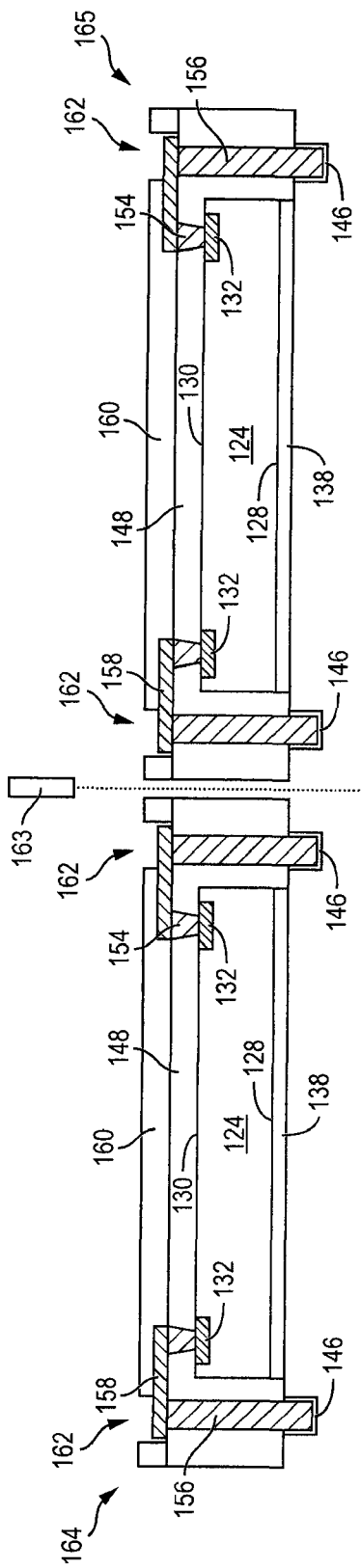

In FIG. 4j, carrier 136 is removed using a chemical etching, mechanical peeling, chemical-mechanical polishing (CMP), mechanical grinding, thermal baking, ultra-violet (UV) light exposure, laser scanning, or wet stripping process to expose encapsulant 148, seed layer 146, and interface layer 138. FIG. 4j further illustrates that adjacent semiconductor die 124 and associated structures are singulated through insulating layer 160 and encapsulant 148 with saw blade or laser cutting tool 163 to form MLPs 164, 165. MLPs 164, 165 have protruded conductive pillars 156 extending from a lower surface of encapsulant 148.

FIGS. 4a-4j illustrate the wafer level fabrication of two MLPs 164, 165 having protruded conductive pillars 156. It will be recognized, however, that it is possible to simultaneously fabricate more than two MLPs using the wafer level processes that were described above.

Figure 5:
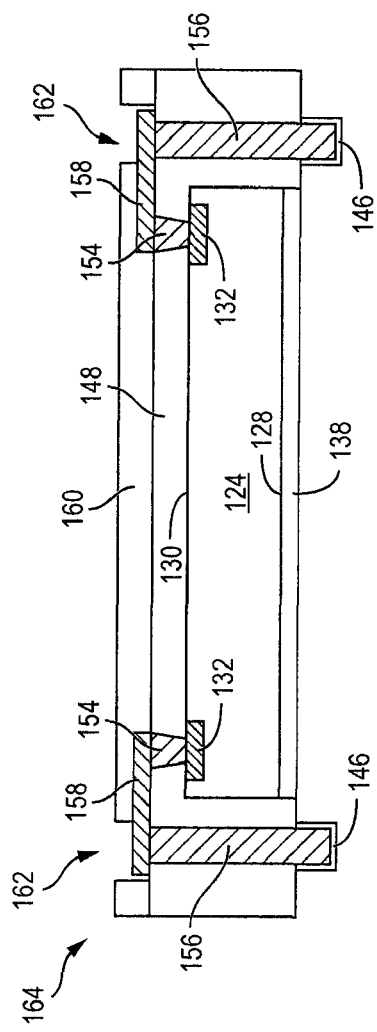
FIG. 5 illustrates a single protruded MLP fabricated by the processes illustrated in FIGS. 4a-4j.

FIG. 5 shows MLP 164 after singulation. Contact pads 132 of semiconductor die 124 are electrically connected to CMVs 154, conductive layer 158, and conductive pillars 156. At an upper part of MLP 164, conductive layer 158 is exposed by vias or holes 162 in insulating layer 160. At a lower part of MLP 164, conductive pillars 156 protrude from a lower surface of encapsulant 148.

Conductive pillars 156 form z-interconnects in MLP 164, that is, conductive pillars provide an electrical path in the vertical direction (z-direction) for MLP 164. Using protruded conductive pillars 156 as z-interconnects is advantageous because it can provide for a finer pitch interconnection compared to when solder bumps or solder balls are used to form z-interconnects. Protruded conductive pillars 156 can also provide an increased joint strength relative to solder bump or solder ball interconnections when multiple MLPs, such as MLP 164, are stacked. As described above, it is also possible to mass-produce protruded MLPs, such as MLP 164, at the wafer level. Furthermore, protruded MLPs, such as MLP 164, can reduce an overall package profile.

Figure 6A:
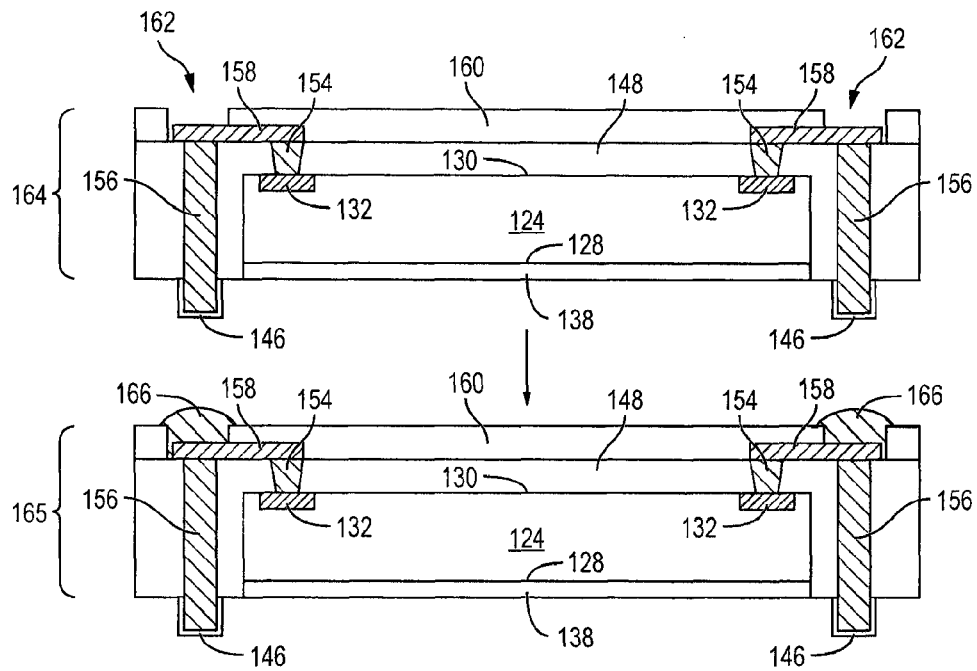
FIGS. 6a-6b illustrate a process of stacking two protruded MLPs to form a stacked semiconductor device.
Figure 6B:
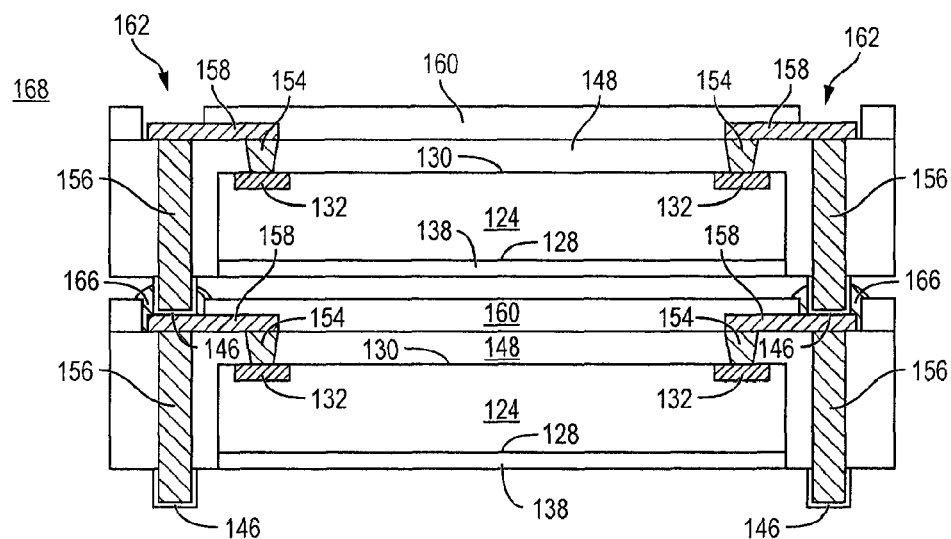

FIGS. 6a-6b illustrate a process of stacking protruded MLPs 164, 165 to form a stacked semiconductor device 168. In FIG. 6a, an electrically conductive paste or adhesive 166 is applied to an exposed surface of conductive layer 158 in the MLP 165. The conductive paste or adhesive 166 includes an electrically conductive material such as Al, Sn, Ni, Au, Ag, lead (Pb), bismuth (Bi), Cu, solder, and combinations thereof, with an optional flux solution. For example, electrically conductive paste or adhesive 166 can be eutectic Sn/Pb, high-lead solder, or lead-free solder.

Protruding ends of conductive pillars 156 of MLP 164 are positioned over MLP 165 such that conductive pillars 156 and seed layer 146 of MLP 164 are aligned over conductive pillars 156 of MLP 165. Next, as shown in FIG. 6b, MLP 164 and 165 are brought together so that seed layer 146 covering lower ends of conductive pillars 156 in MLP 164 contacts conductive layer 158 in MLP 165 in a region overlying upper ends of conductive pillars 156 in MLP 165. Seed layer 146 of MLP 164 and conductive layer 158 of MLP 165 are bonded together with conductive paste or adhesive 166, forming an electrical and mechanical connection between conductive pillars 156 of MLPs 164 and 165. In alternative embodiments, seed layer 146 and conductive pillars 156 of MLP 164 can be directly connected to conductive layer 158 of MLP 165 using heat and pressure to form a metallurgical connection between conductive pillars 156 of MLPs 164 and 165. Any number of MLPs, such as MLPs 164 or 165, may be stacked in the manner described above.

In stacked semiconductor device 168, contact pads 132 in MLPs 164 and 165 are electrically connected to conductive pillars 156 through CMVs 154 and conductive layer 158, and conductive pillars 156 of MLP 164 are electrically connected to conductive pillars 156 of MLP 165 as described above. Accordingly, circuits disposed in semiconductor die 124 of MLP 164 are electrically connected to circuits disposed in semiconductor die 124 of MLP 165, and external power, ground, and signal connections can be made with the circuits of the semiconductor die 124 by contacting or attaching conductive pillars 156 to an external power, ground, or signal source (not shown).

The use of protruded conductive pillars 156 for stacking MLPs 164 and 165 as described above can result in improved joint strength and finer pitch interconnections relative to other techniques that rely upon solder bumps or solder balls for package stacking and z-interconnects. The protruded conductive pillars 156 can also create an offset between MLPs 164, 165, where the offset provides a protected space for other circuits or components that may be included on an underlying MLP.

Figure 7D:
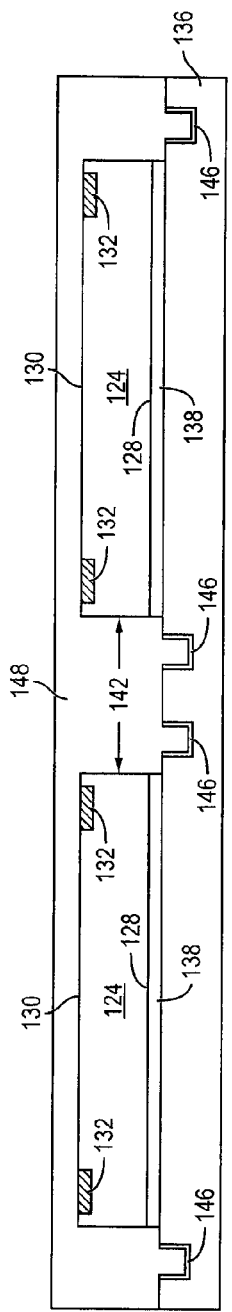

FIGS. 7a-7j illustrate, in relation to FIGS. 1 and 2a-2c, processes for making another MLP having protruded conductive pillars. Referring to FIG. 7a, a portion 123 of semiconductor wafer 120 from FIG. 3a includes two semiconductor die 124. A wafer-form substrate or carrier 136 contains temporary or sacrificial base material such as silicon, polymer, beryllium oxide, or other suitable low-cost, rigid material for structural support. An interface layer or double-sided tape 138 is formed over carrier 136 as a temporary adhesive bonding film or etch-stop layer. Portion 123 of semiconductor wafer 120 from FIG. 3a is mounted back surface 128 to carrier 136 and interface layer 138, resulting in the structure shown in FIG. 7a.

In FIG. 7b, portion 123 of semiconductor wafer 120 is singulated through saw street 126 using a saw blade or laser cutting tool 140 to form channel 142 and separate the wafer into individual semiconductor die 124 which remain affixed to carrier 136 and interface layer 138. Channel 142 has sufficient width to contain multiple later-formed conductive pillars.

In FIG. 7c, a plurality of vias or holes 144 are formed partially through selected locations on carrier 136 using laser drilling, mechanical drilling, or DRIE. Next, a seed layer 146 is conformally deposited on surfaces of carrier 136 that are exposed by vias or holes 144. Seed layer 146 can be formed using an epitaxial growth, electrolytic plating, electroless plating, or another suitable metal deposition process. Seed layer 146 includes a conductive material such as Al, Cu, Sn, Ni, Au, Ag, Ti, W, poly-silicon, or other suitable electrically conductive material.

In FIG. 7d, an encapsulant or molding compound 148 is formed around semiconductor die 124, in channel 142 between semiconductor die 124, and in vias or holes 144 using a paste printing, compressive molding, transfer molding, liquid encapsulant molding, vacuum lamination, spin coating, or other suitable applicator. Encapsulant 148 can be polymer composite material, such as epoxy resin with filler, epoxy acrylate with filler, or polymer with proper filler. Encapsulant 148 is non-conductive and environmentally protects semiconductor die 124 from external elements and contaminants.

Figure 7E:
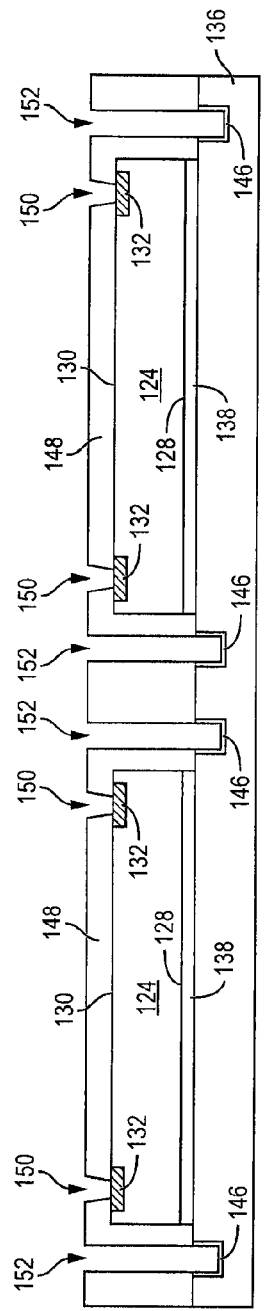

In FIG. 7e, after encapsulant 148 is cured, a plurality of vias or holes 150 is formed through encapsulant 148 down to contact pads 132 using laser drilling, mechanical drilling, or DRIE. Vias 150 can also be formed with a positive encapsulant-blocking via structure in the mold chase. Likewise, a plurality of vias or holes 152 is also formed through encapsulant 148 down to seed layer 146 using laser drilling, mechanical drilling, or DRIE. Vias or holes 152 can also be formed with a positive encapsulant-blocking via structure in the mold chase.

Figure 7F:
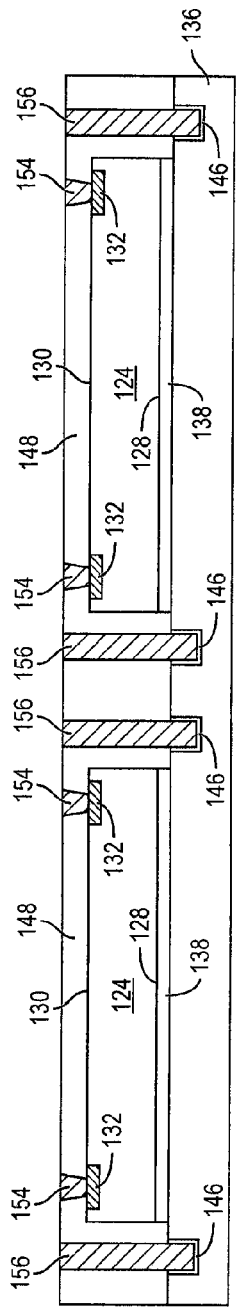

In FIG. 7f, vias or holes 150 and 152 are filled with Al, Cu, Sn, Ni, Au, Ag, Ti, W, poly-silicon, or other suitable electrically conductive material to form z-direction vertical interconnect CMVs 154 that are disposed on contact pads 132 and conductive pillars 156 that are disposed on seed layer 146. Vias or holes 150 and 152 can be filled using an electrolytic plating, electroless plating, screen printing, sputtering, or some other suitable metal deposition process.

Figure 7G:
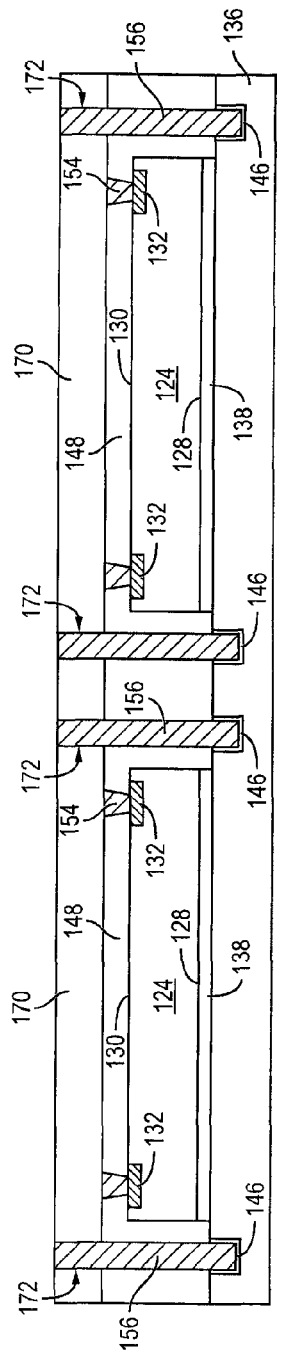

In FIG. 7g, a sacrificial layer 170 is formed over encapsulant 148, CMVs 154, and conductive pillars 156. Sacrificial layer 170 can be formed using an evaporation, thin-film lamination, CVD, or PVD process. Next, a portion of sacrificial layer 170 is removed to form holes or vias 172 that expose conductive pillars 156. Holes or vias 172 can be formed using an etching process. Holes or vias 172 are then filled with Al, Cu, Sn, Ni, Au, Ag, Ti, W, poly-silicon, or other suitable electrically conductive material to contact conductive pillars 156 and extend a height of conductive pillars 156 above a surface of encapsulant 148. A conductive material that is used to fill holes or vias 172 can be the same material or a different material than a conductive material that is used to fill holes or vias 150, 152 of FIG. 7e.

Figure 7H:
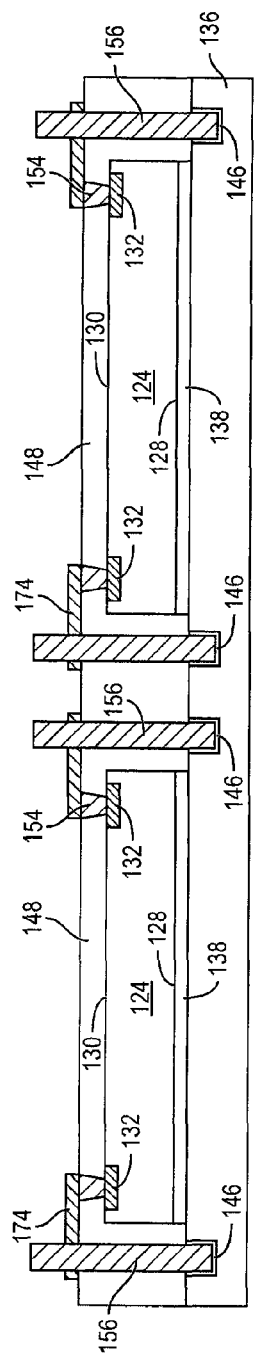

In FIG. 7h, sacrificial layer 170 is removed from over encapsulant 148 and CMVs 154. Sacrificial layer 170 can be removed using a chemical etching process. In alternative embodiments, if sacrificial layer 170 is applied using a thin-film lamination technique, sacrificial layer 170 can be removed by exposure to Ultra-Violet (UV) light. Next, an electrically conductive layer 174 is formed over encapsulant 148, over CMVs 154, and around conductive pillars 156. Conductive layer 174 is formed using a patterning and metal deposition process such as a printing, PVD, CVD, sputtering, electrolytic plating, or electroless plating process. Conductive layer 174 can include one or more layers of Al, Cu, Sn, Ni, Au, Ag, or other suitable electrically conductive material. Conductive layer 174 electrically connects CMVs 154 to conductive pillars 156.

Figure 7I:
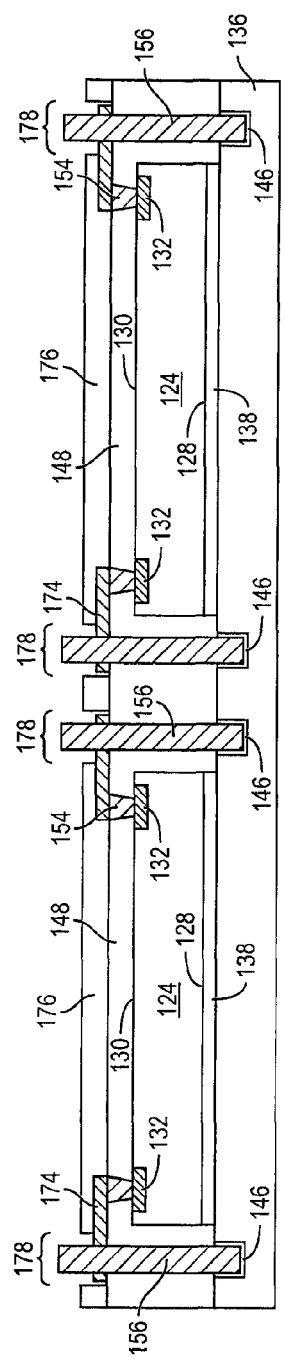

In FIG. 7i, an insulating or passivation layer 176 is formed over encapsulant 148, conductive layer 174, CMVs 154, and around conductive pillars 156 using a PVD, CVD, printing, spin coating, spray coating, sintering, or thermal oxidation process. Insulating layer 176 is formed such that conductive pillars 156 protrude above a surface of insulating layer 176. Insulating layer 176 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 176 is removed by an etching process to form vias or holes 178 that expose upper surfaces of conductive pillars 156 and an upper surface of conductive layer 174. That is, a portion of insulating layer 176 that surrounds conductive pillars 158 is removed to form vias or holes 178.

In FIG. 7j, carrier 136 is removed using a chemical etching, mechanical peeling, chemical-mechanical polishing (CMP), mechanical grinding, thermal baking, ultra-violet (UV) light exposure, laser scanning, or wet stripping process to expose encapsulant 148, seed layer 146, and interface layer 138. FIG. 7j further illustrates that adjacent semiconductor die 124 and associated structures are singulated through insulating layer 176 and encapsulant 148 with saw blade or laser cutting tool 163 to form MLPs 180, 182. MLPs 180, 182 have protruded conductive pillars 156 that extend above an upper surface of insulating layer 176 and that extend below a lower surface of encapsulant 148.

FIGS. 7a-7j illustrate the wafer level fabrication of two MLPs 180, 182 having protruded conductive pillars 156. It will be recognized, however, that it is possible to simultaneously fabricate more than two MLPs using the wafer level processes that were described above.

FIG. 8 shows MLP 182 after singulation. Contact pads 132 of semiconductor die 124 are electrically connected to CMVs 154, conductive layer 174, and conductive pillars 156. At an upper part of MLP 182, upper portions of conductive pillars 156 protrude from an upper surface of insulating layer 176, and vias or holes 178 in insulating layer 176 expose upper portions of conductive pillars 156 and portions of conductive layer 174. At a lower part of MLP 182, conductive pillars 156 and seed layer 146 protrude from a lower surface of encapsulant 148.

Conductive pillars 156 form z-interconnects in MLP 182, that is, conductive pillars provide an electrical path in the vertical direction (z-direction) for MLP 182. Using protruded conductive pillars 156 as z-interconnects is advantageous because it can provide for a finer pitch interconnection compared to when solder bumps or solder balls are used to form z-interconnects. Protruded conductive pillars 156 can also provide an increased joint strength relative to solder bump or solder ball interconnections when multiple MLPs, such as MLP 182, are stacked. As described above, it is also possible to mass-produce protruded MLPs, such as MLP 182, at the wafer level. Furthermore, protruded MLPs, such as MLP 182, can reduce an overall package profile.

Figure 9A:
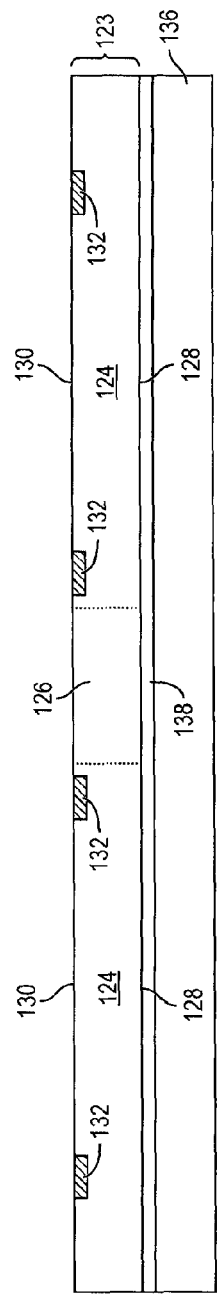

FIGS. 9a-9j illustrate, in relation to FIGS. 1 and 2a-2c, processes for making still another MLP having protruded conductive pillars. FIG. 9a illustrates a portion 123 of semiconductor wafer 120 from FIG. 3a, where portion 123 includes two semiconductor die 124. FIG. 9a further illustrates a wafer-form substrate or carrier 136 that contains temporary or sacrificial base material such as silicon, polymer, beryllium oxide, or other suitable low-cost, rigid material for structural support. An interface layer or double-sided tape 138 is formed over carrier 136 as a temporary adhesive bonding film or etch-stop layer. Portion 123 is mounted back surface 128 to carrier 136 and interface layer 138, resulting in the structure shown in FIG. 9a.

Figure 9B:
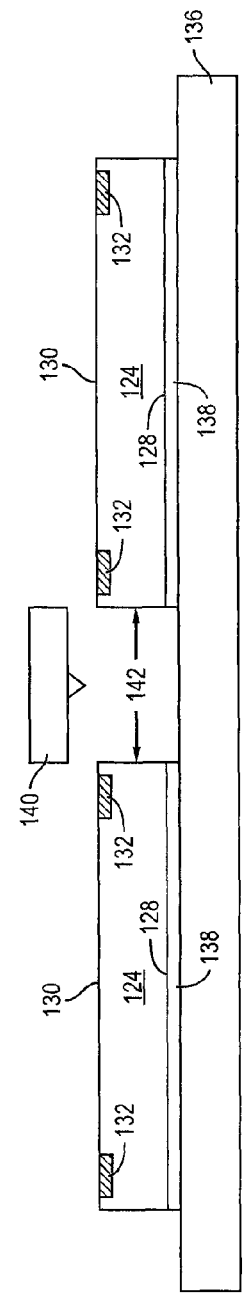

In FIG. 9b, portion 123 of FIG. 9a is singulated through saw street 126 using a saw blade or laser cutting tool 140 to form channel 142 and separate the wafer into individual semiconductor die 124 which remain affixed to carrier 136 and interface layer 138. Channel 142 has sufficient width to contain multiple later-formed conductive pillars.

Figure 9C:
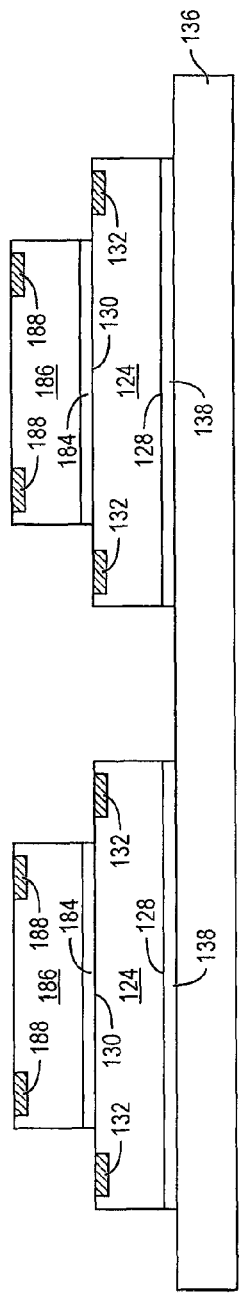

In FIG. 9c, an interface layer or double-sided tape 184 is formed over semiconductor die 124 as a temporary adhesive bonding film or etch-stop layer. Back surfaces of semiconductor die 186 are then mounted to semiconductor die 124 and to interface layer 184 using a pick and place operation. The semiconductor die 186 include contact pads 188.

Figure 9D:
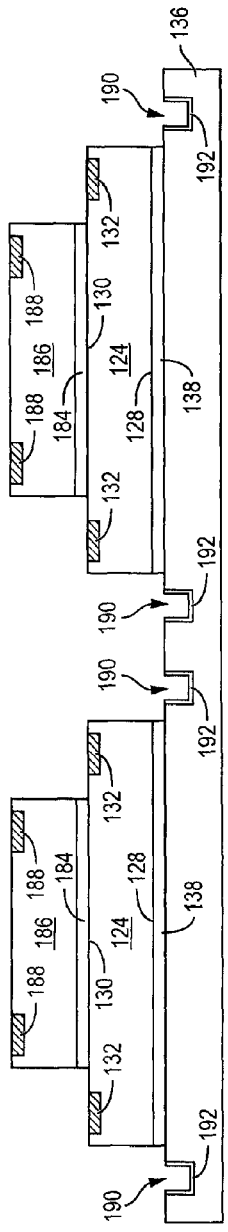

In FIG. 9d, a plurality of vias or holes 190 are formed partially through selected locations on carrier 136 using laser drilling, mechanical drilling, or DRIE. Next, a seed layer 192 is conformally deposited on surfaces of carrier 136 that are exposed by vias or holes 190. Seed layer 192 can be formed using an epitaxial growth, electrolytic plating, electroless plating, or another suitable metal deposition process. Seed layer 192 includes a conductive material such as Al, Cu, Sn, Ni, Au, Ag, Ti, W, poly-silicon, or other suitable electrically conductive material.

Figure 9E:
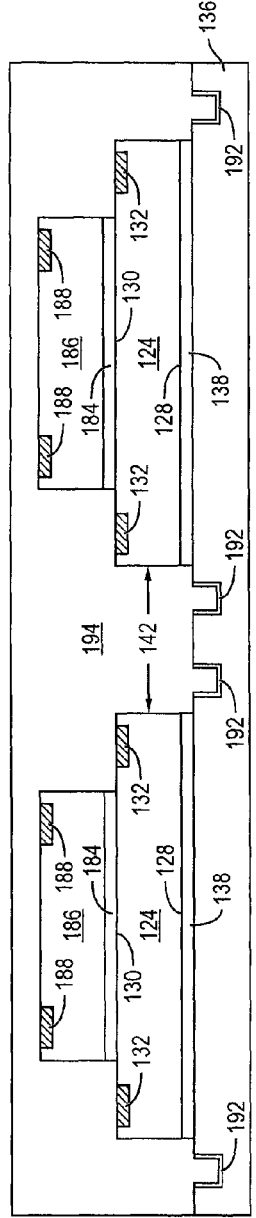

In FIG. 9e, an encapsulant or molding compound 194 is formed around semiconductor die 124, around semiconductor die 186, in channel 142 between semiconductor die 124, and in vias or holes 190 using a paste printing, compressive molding, transfer molding, liquid encapsulant molding, vacuum lamination, spin coating, or other suitable applicator. Encapsulant 194 can be polymer composite material, such as epoxy resin with filler, epoxy acrylate with filler, or polymer with proper filler. Encapsulant 194 is non-conductive and environmentally protects semiconductor die 124 and 186 from external elements and contaminants.

Figure 9F:
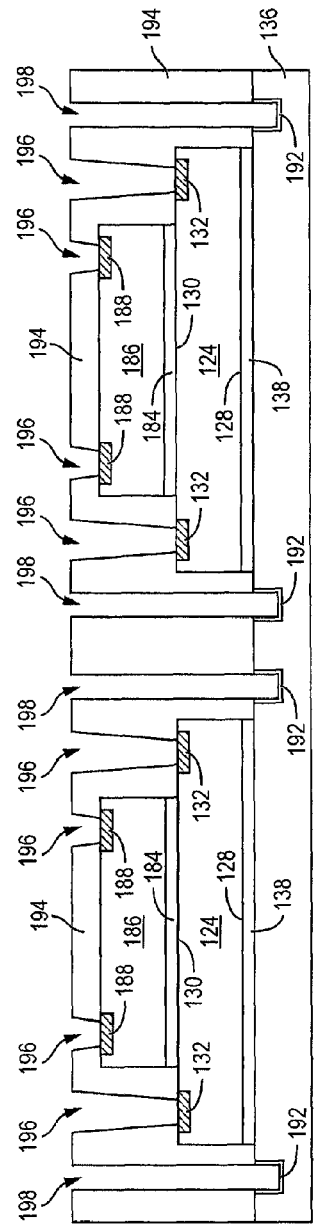

In FIG. 9f, after encapsulant 194 is cured, a plurality of vias or holes 196 is formed through encapsulant 194 down to contact pads 132 and 188 using laser drilling, mechanical drilling, or DRIE. Vias 196 can also be formed with a positive encapsulant-blocking via structure in the mold chase. Likewise, a plurality of vias or holes 198 is also formed through encapsulant 194 down to seed layer 192 using laser drilling, mechanical drilling, or DRIE. Vias 198 can also be formed with a positive encapsulant-blocking via structure in the mold chase.

In FIG. 9g, vias 196 and 198 are filled with Al, Cu, Sn, Ni, Au, Ag, Ti, W, poly-silicon, or other suitable electrically conductive material. Vias 196 and 198 can be filled using an electrolytic plating, an electroless plating, a screen printing, a sputtering, or some other suitable metal deposition process. Vias 196 and 198 are filled with electrically conductive material to form z-direction vertical interconnect CMVs 200 that are disposed on contact pads 132 and contact pads 188 and conductive pillars 202 that are disposed on seed layer 192.

In FIG. 9h, an electrically conductive layer 204 is formed over encapsulant 194, over CMVs 200, and over conductive pillars 202. The conductive layer 204 is formed using a patterning and metal deposition process such as a printing, PVD, CVD, sputtering, electrolytic plating, or electroless plating process. Conductive layer 204 can include one or more layers of Al, Cu, Sn, Ni, Au, Ag, or other suitable electrically conductive material. Conductive layer 204 electrically connects CMVs 200 to conductive pillars 202.

Figure 9I:
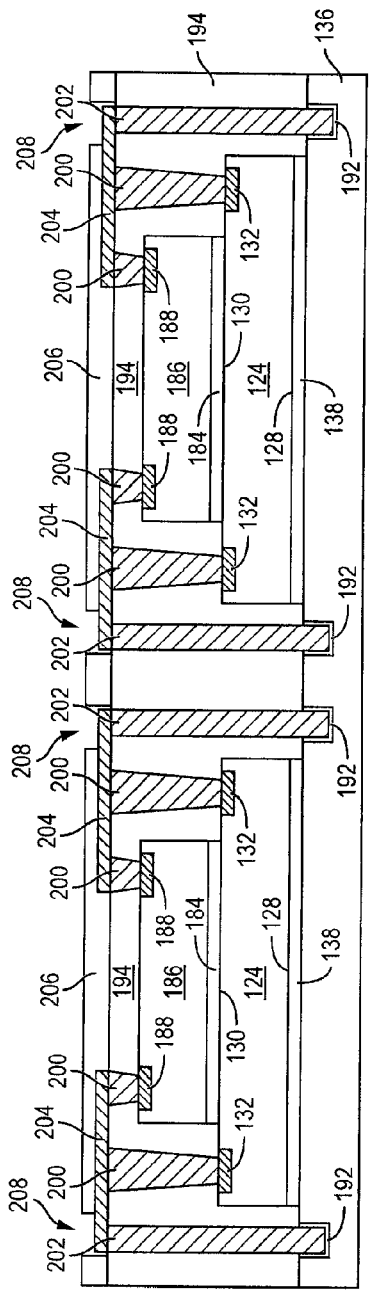

In FIG. 9i, an insulating or passivation layer 206 is formed over encapsulant 148, conductive layer 204, CMVs 200, and conductive pillars 202 using a PVD, CVD, printing, spin coating, spray coating, sintering, or thermal oxidation process. Insulating layer 206 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 206 is removed by an etching process to form vias or holes 208 that expose conductive layer 204.

Figure 9J:
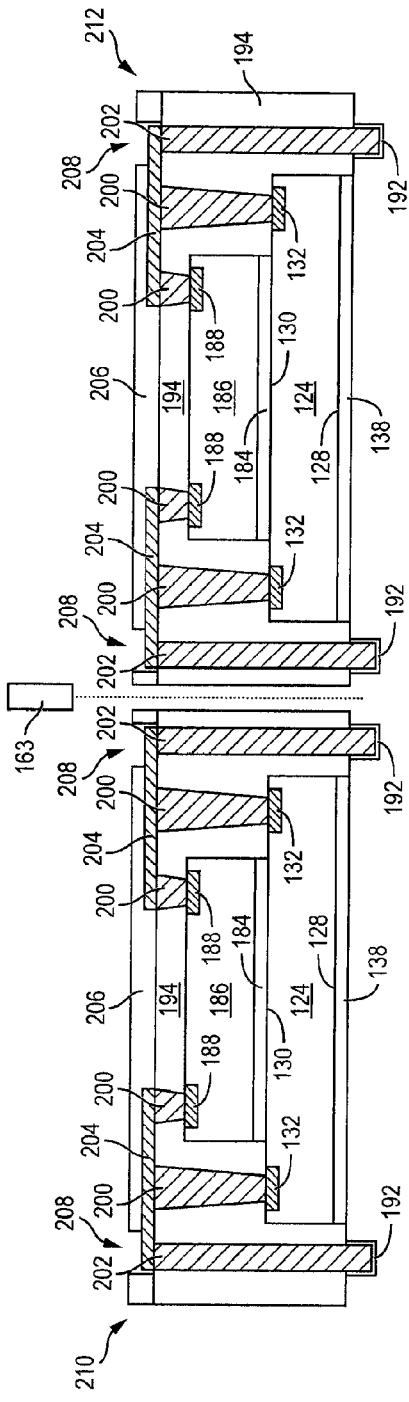

In FIG. 9j, carrier 136 is removed using a chemical etching, mechanical peeling, chemical-mechanical polishing (CMP), mechanical grinding, thermal baking, ultra-violet (UV) light exposure, laser scanning, or wet stripping process to expose encapsulant 194, seed layer 192, and interface layer 138. FIG. 9j further illustrates that adjacent stacked semiconductor die 124, 186 and associated structures are singulated through insulating layer 206 and encapsulant 194 with saw blade or laser cutting tool 163 to form MLPs 210, 212. MLPs 210, 212 have protruded conductive pillars 202 extending from a lower surface of encapsulant 194.

FIGS. 9a-9j illustrate the wafer level fabrication of two MLPs 210, 212 having protruded conductive pillars 202. It will be recognized, however, that it is possible to simultaneously fabricate more than two MLPs using the wafer level processes that were described above.

Figure 10:
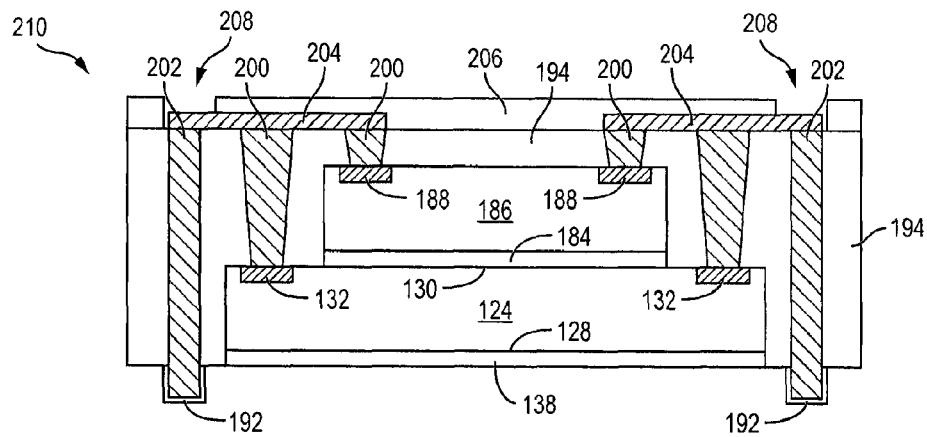
FIG. 10 illustrates a single protruded MLP fabricated by the processes illustrated in FIGS. 9a-9j.

FIG. 10 shows MLP 210 after singulation. Contact pads 132 of semiconductor die 124 and contact pads 188 of semiconductor die 186 are electrically connected to CMVs 200, conductive layer 204, and conductive pillars 202. At an upper part of MLP 210, upper surfaces of conductive layer 204 are exposed by vias or holes 208 in insulating layer 206. At a lower part of MLP 210, conductive pillars 202 and seed layer 192 protrude from a lower surface of encapsulant 194.

Conductive pillars 202 form z-interconnects in MLP 210, that is, conductive pillars provide an electrical path in the vertical direction (z-direction) for MLP 210. Using protruded conductive pillars 202 as z-interconnects is advantageous because it can provide for a finer pitch interconnection compared to when solder bumps or solder balls are used to form z-interconnects. Protruded conductive pillars 202 can also provide an increased joint strength relative to solder bump or solder ball interconnections when multiple MLPs, such as MLP 210, are stacked. As described above, it is also possible to mass-produce protruded MLPs, such as MLP 210, at the wafer level. Furthermore, protruded MLPs, such as MLP 210, can reduce an overall package profile.

Figure 11:
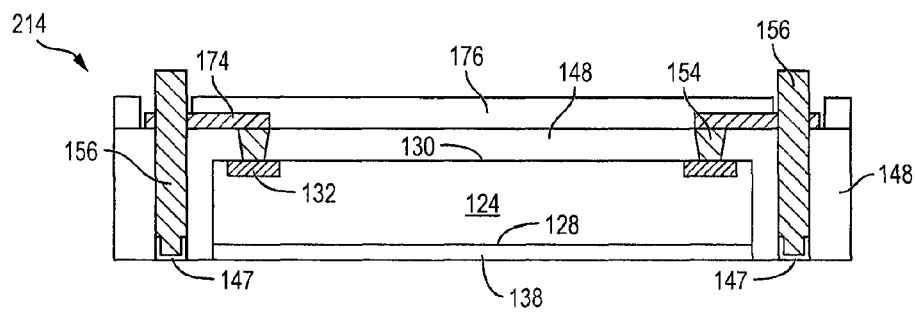
FIG. 11 illustrates a single protruded MLP fabricated by slightly modifying the process steps illustrated by FIGS. 7a-7j.

FIG. 11 illustrates a single protruded MLP 214 fabricated by slightly modifying the process steps illustrated by FIGS. 7a-7j. A process of fabricating MLP 214 is described in the following paragraphs with reference to FIGS. 7a-7j, wherein the modifications to the processes of FIGS. 7a-7j are identified.

Similar to FIG. 7a, a portion 123 of semiconductor wafer 120 (from FIG. 3a) includes two semiconductor die 124. A wafer-form substrate or carrier 136 contains temporary or sacrificial base material such as silicon, polymer, beryllium oxide, or other suitable low-cost, rigid material for structural support. An interface layer or double-sided tape 138 is formed over carrier 136 as a temporary adhesive bonding film or etch-stop layer. Portion 123 is mounted back surface 128 to carrier 136 and interface layer 138, resulting in the structure shown in FIG. 7a.

Similar to FIG. 7b, portion 123 is singulated through saw street 126 using a saw blade or laser cutting tool 140 to form channel 142 and separate the wafer into individual semiconductor die 124 which remain affixed to carrier 136 and interface layer 138. Channel 142 has sufficient width to contain multiple later-formed conductive pillars.

At this point a process for fabricating MLP 214 of FIG. 11 deviates from a process for fabricating MLP 182 of FIG. 8. Comparing FIGS. 11 and 8, it is evident that MLP 214 includes conductive pillars 156 that do not extend below a lower surface of encapsulant 148, while conductive pillars 156 of MLP 182 extend below a lower surface of encapsulant 148. Thus, a process step illustrated in FIG. 7c, where a plurality of vias or holes 144 are formed partially through selected locations on carrier 136 using laser drilling, mechanical drilling, or DRIE, is not required for MLP 214. In effect, MLP 214 is fabricated without a process illustrated in FIG. 7c for MLP 182, and the absence of vias or holes 144 should be kept in mind for the remainder of the following description regarding the fabrication of MLP 214.

Next, similar to FIG. 7d, an encapsulant or molding compound 148 is formed around semiconductor die 124 and in channel 142 between semiconductor die 124 using a paste printing, compressive molding, transfer molding, liquid encapsulant molding, vacuum lamination, spin coating, or other suitable applicator. Encapsulant 148 can be polymer composite material, such as epoxy resin with filler, epoxy acrylate with filler, or polymer with proper filler. Encapsulant 148 is non-conductive and environmentally protects semiconductor die 124 from external elements and contaminants.

Next, similar to FIG. 7e, after encapsulant 148 is cured, a plurality of vias or holes 150 is formed through encapsulant 148 down to contact pads 132 using laser drilling, mechanical drilling, or DRIE. Vias 150 can also be formed with a positive encapsulant-blocking via structure in the mold chase. Similar to FIG. 7e, a plurality of vias or holes 152 is also formed using laser drilling, mechanical drilling, or DRIE. But, instead of forming vias or holes 152 below an upper surface of carrier 136 as shown in FIG. 7e, vias or holes 152 are only formed through encapsulant 148 down to an upper surface of carrier 136. Vias 152 can also be formed with a positive encapsulant-blocking via structure in the mold chase.

Next, a seed layer 147 (FIG. 11) is conformally deposited. However, instead of depositing a seed layer on surfaces of carrier 136 that are exposed by vias or holes 144 to form seed layer 146 as shown in FIG. 7c, seed layer 147 (FIG. 11) is deposited on upper surfaces of carrier 136 and on lower sidewall portions of encapsulant 148 that are exposed by vias or holes 152. Remember that, unlike FIG. 7e, vias or holes 152 of MLP 214 (FIG. 11) do not penetrate below an upper surface of carrier 136. Seed layer 147 can be formed using an epitaxial growth, electrolytic plating, electroless plating, or another suitable metal deposition process. Seed layer 147 includes a conductive material such as Al, Cu, Sn, Ni, Au, Ag, titanium (Ti), tungsten (W), poly-silicon, or other suitable electrically conductive material.

Next, similar to FIG. 7f, vias or holes 150 and 152 are filled with Al, Cu, Sn, Ni, Au, Ag, Ti, W, poly-silicon, or other suitable electrically conductive material to form z-direction vertical interconnect CMVs 154 that are disposed on contact pads 132 and conductive pillars 156 that are disposed on carrier 136. Vias or holes 150 and 152 can be filled using an electrolytic plating, electroless plating, screen printing, sputtering, or some other suitable metal deposition process.

Similar to FIG. 7g, a sacrificial layer 170 is formed over encapsulant 148, CMVs 154, and conductive pillars 156. Sacrificial layer 170 can be formed using an evaporation, thin-film lamination, CVD, or PVD process. Next, a portion of sacrificial layer 170 is removed to form holes or vias 172 that expose conductive pillars 156. Holes or vias 172 can be formed using an etching process. Holes or vias 172 are then filled with Al, Cu, Sn, Ni, Au, Ag, Ti, W, poly-silicon, or other suitable electrically conductive material to contact conductive pillars 156 and extend a height of conductive pillars 156 above a surface of encapsulant 148. A conductive material that is used to fill holes or vias 172 can be the same material or a different material than a conductive material that is used to fill holes or vias 150, 152.

Similar to FIG. 7h, sacrificial layer 170 is removed from over encapsulant 148 and CMVs 154. Sacrificial layer 170 can be removed using a chemical etching process. In alternative embodiments, if sacrificial layer 170 is applied using a thin-film lamination technique, sacrificial layer 170 can be removed by exposure to Ultra-Violet (UV) light. Next, an electrically conductive layer 174 is formed over encapsulant 148, over CMVs 154, and around conductive pillars 156. Conductive layer 174 is formed using a patterning and metal deposition process such as a printing, PVD, CVD, sputtering, electrolytic plating, or electroless plating process. Conductive layer 174 can include one or more layers of Al, Cu, Sn, Ni, Au, Ag, or other suitable electrically conductive material. Conductive layer 174 electrically connects CMVs 154 to conductive pillars 156.

Similar to FIG. 7i, an insulating or passivation layer 176 is formed over encapsulant 148, conductive layer 174, CMVs 154, and around conductive pillars 156 using a PVD, CVD, printing, spin coating, spray coating, sintering, or thermal oxidation process. Insulating layer 176 is formed such that conductive pillars 156 protrude above a surface of insulating layer 176. Insulating layer 176 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 176 is removed by an etching process to form vias or holes 178 that expose upper surfaces of conductive pillars 156 and an upper surface of conductive layer 174. That is, a portion of insulating layer 176 that surrounds conductive pillars 158 is removed to form vias or holes 178.

Similar to FIG. 7j, carrier 136 is removed using a chemical etching, mechanical peeling, chemical-mechanical polishing (CMP), mechanical grinding, thermal baking, ultra-violet (UV) light exposure, laser scanning, or wet stripping process to expose encapsulant 148, a bottom surface of conductive pillars 156, and interface layer 138. Also similar to FIG. 7j, adjacent semiconductor die 124 and associated structures are singulated through insulating layer 176 and encapsulant 148 with saw blade or laser cutting tool 163 to form MLPs 214. Similar to MLPs 180, 182 of FIG. 7j, MLP 214 has conductive pillars 156 that extend above an upper surface of insulating layer 176. However, unlike MLPs 180, 182, conductive pillars 156 of MLP 214 do not extend below a lower surface of encapsulant 148.

FIG. 11 shows MLP 214 after singulation. Contact pads 132 of semiconductor die 124 are electrically connected to CMVs 154, conductive layer 174, and conductive pillars 156. At an upper part of MLP 214, upper portions of conductive pillars 156 are exposed by vias or holes 178 in insulating layer 176.

Conductive pillars 156 form z-interconnects in MLP 214, that is, conductive pillars provide an electrical path in the vertical direction (z-direction) for MLP 214. Using protruded conductive pillars 156 as z-interconnects is advantageous because it can provide for a finer pitch interconnection compared to when solder bumps or solder balls are used to form z-interconnects. Protruded conductive pillars 156 can also provide an increased joint strength relative to solder bump or solder ball interconnections when multiple MLPs, such as MLP 214, are stacked. As described above, it is also possible to mass-produce protruded MLPs, such as MLP 214, at the wafer level. Furthermore, protruded MLPs, such as MLP 214, can reduce an overall package profile.

Figure 12:
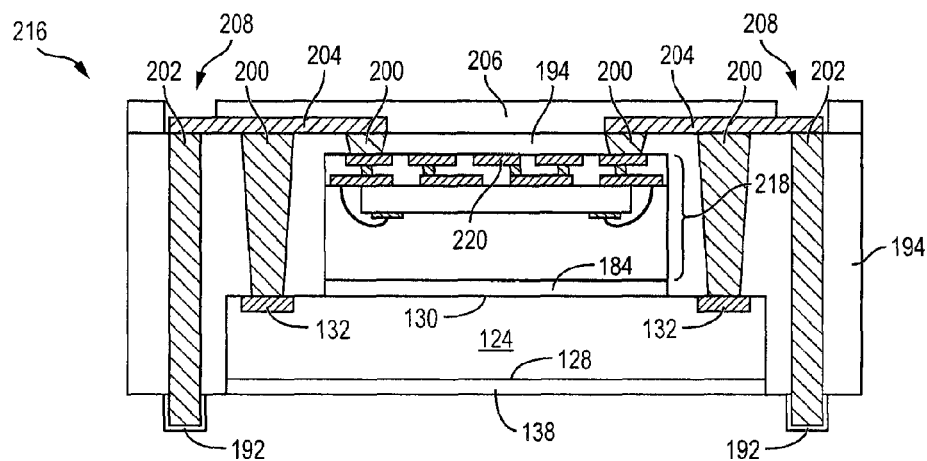
FIG. 12 illustrates a single protruded MLP fabricated by slightly modifying the process steps illustrated by FIGS. 9a-9j.

FIG. 12 illustrates a single protruded MLP 216 fabricated by slightly modifying the process steps illustrated by FIGS. 9a-9j. A process of fabricating MLP 216 is described in the following paragraphs with reference to FIGS. 9a-9j, wherein the modifications to the processes of FIGS. 9a-9j are identified.

Similar to FIG. 9a, a portion 123 of semiconductor wafer 120 (from FIG. 3a) includes two semiconductor die 124. FIG. 9a further illustrates a wafer-form substrate or carrier 136 that contains temporary or sacrificial base material such as silicon, polymer, beryllium oxide, or other suitable low-cost, rigid material for structural support. An interface layer or double-sided tape 138 is formed over carrier 136 as a temporary adhesive bonding film or etch-stop layer. Portion 123 is mounted back surface 128 to carrier 136 and interface layer 138, resulting in the structure shown in FIG. 9a.

Similar to FIG. 9b, portion 123 of semiconductor wafer 120 is singulated through saw street 126 using a saw blade or laser cutting tool 140 to form channel 142 and separate the wafer into individual semiconductor die 124 which remain affixed to carrier 136 and interface layer 138. Channel 142 has sufficient width to contain multiple later-formed conductive pillars.

At this point a process for fabricating MLP 216 of FIG. 12 deviates from a process for fabricating MLP 210 of FIG. 10. Comparing FIGS. 10 and 12, instead of using a second semiconductor die 186 as shown for MLP 210, MLP 216 includes an Industry Standard Module (ISM) 218 having contact pads 220 that is affixed to semiconductor die 124. Thus, with respect to a process for fabricating MLP 216, a process step illustrated in FIG. 9c, where a back surface of semiconductor die 186 is mounted to semiconductor die 124 and to interface layer 184, is modified by substituting an ISM 218 for semiconductor die 186. The replacement of semiconductor die 186 of MLP 210 with ISM 218 for fabricating MLP 216 should be kept in mind for the remainder of the following description regarding the fabrication of MLP 216.

Next, similar to FIG. 9d, a plurality of vias or holes 190 is formed partially through selected locations on carrier 136 using laser drilling, mechanical drilling, or deep reactive ion etching (DRIE). Next, a seed layer 192 is conformally deposited on surfaces of carrier 136 that are exposed by vias or holes 190. Seed layer 192 can be formed using an epitaxial growth, electrolytic plating, electroless plating, or another suitable metal deposition process. Seed layer 192 includes a conductive material such as Al, Cu, Sn, Ni, Au, Ag, Ti, W, poly-silicon, or other suitable electrically conductive material.

Similar to FIG. 9e, an encapsulant or molding compound 194 is formed around semiconductor die 124, around ISMs 218, in channel 142 between semiconductor die 124, and in vias or holes 190 using a paste printing, compressive molding, transfer molding, liquid encapsulant molding, vacuum lamination, spin coating, or other suitable applicator. Encapsulant 194 can be polymer composite material, such as epoxy resin with filler, epoxy acrylate with filler, or polymer with proper filler. Encapsulant 194 is non-conductive and environmentally protects semiconductor die 124 and ISMs 218 from external elements and contaminants.

Similar to FIG. 9f, after encapsulant 194 is cured, a plurality of vias or holes 196 is formed through encapsulant 194 down to contact pads 132 and 220 using laser drilling, mechanical drilling, or DRIE. Vias 196 can also be formed with a positive encapsulant-blocking via structure in the mold chase. Likewise, a plurality of vias or holes 198 is also formed through encapsulant 194 down to seed layer 192 using laser drilling, mechanical drilling, or DRIE. Vias 198 can also be formed with a positive encapsulant-blocking via structure in the mold chase.

Similar to FIG. 9g, vias 196 and 198 are filled with Al, Cu, Sn, Ni, Au, Ag, Ti, W, poly-silicon, or other suitable electrically conductive material. Vias 196 and 198 can be filled using an electrolytic plating, an electroless plating, a screen printing, a sputtering, or some other suitable metal deposition process. Vias 196 and 198 are filled with electrically conductive material to form z-direction vertical interconnect CMVs 200 that are disposed on contact pads 132 and 220 and conductive pillars 202 that are disposed on seed layer 192.

Similar to FIG. 9h, an electrically conductive layer 204 is formed over encapsulant 148, over CMVs 200, and over conductive pillars 202. The conductive layer 204 is formed using a patterning and metal deposition process such as a printing, PVD, CVD, sputtering, electrolytic plating, or electroless plating process. Conductive layer 204 can include one or more layers of Al, Cu, Sn, Ni, Au, Ag, or other suitable electrically conductive material. Conductive layer 204 electrically connects CMVs 200 to conductive pillars 202.

Similar to FIG. 9i, an insulating or passivation layer 206 is formed over encapsulant 148, conductive layer 204, CMVs 200, and conductive pillars 202 using a PVD, CVD, printing, spin coating, spray coating, sintering, or thermal oxidation process. Insulating layer 206 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 206 is removed by an etching process to form vias or holes 208 that expose conductive layer 204.

Similar to FIG. 9j, carrier 136 is removed using a chemical etching, mechanical peeling, chemical-mechanical polishing (CMP), mechanical grinding, thermal baking, ultra-violet (UV) light exposure, laser scanning, or wet stripping process to expose encapsulant 148, seed layer 192, and interface layer 138. Also similar to FIG. 9j, adjacent stacked semiconductor die 124 and ISMs 218 and associated structures are singulated through insulating layer 206 and encapsulant 194 with saw blade or laser cutting tool 163 to form MLPs 216. Like MLPs 210, 212 of FIG. 9j, MLP 216 of FIG. 12 has protruded conductive pillars 202 extending from a lower surface of encapsulant 194.

FIG. 12 shows MLP 216 after singulation. Contact pads 132 of semiconductor die 124 and contact pads 220 of ISM 218 are electrically connected to CMVs 200, conductive layer 204, and conductive pillars 202. At an upper part of MLP 216, upper surfaces of conductive layers 204 are exposed by vias or holes 208 in insulating layer 206. At a lower part of MLP 216, conductive pillars 202 protrude from a lower surface of encapsulant 194.

Conductive pillars 202 form z-interconnects in MLP 216, that is, conductive pillars provide an electrical path in the vertical direction (z-direction) for MLP 216. Using protruded conductive pillars 202 as z-interconnects is advantageous because it can provide for a finer pitch interconnection compared to when solder bumps or solder balls are used to form z-interconnects. Protruded conductive pillars 202 can also provide an increased joint strength relative to solder bump or solder ball interconnections when multiple MLPs, such as MLP 216, are stacked. As described above, it is also possible to mass-produce protruded MLPs, such as MLP 216, at the wafer level. Furthermore, protruded MLPs, such as MLP 216, can reduce an overall package profile.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor device, comprising:
    a substrate;
    a first semiconductor die disposed over the substrate;
    an encapsulant deposited over the substrate and over a surface of the first semiconductor die;
    a first conductive via formed through the encapsulant and extending beyond a first surface of the encapsulant only partially into the substrate;
    a second conductive via formed through the encapsulant over the first semiconductor die; and
    a conductive layer formed over the encapsulant between the first conductive via and second conductive via.

2. The semiconductor device of claim 1, further including an insulating layer formed over the conductive layer and encapsulant.

3. The semiconductor device of claim 1, further including a seed layer formed over a portion of the first conductive via extending beyond the first surface of the encapsulant.

4. The semiconductor device of claim 1, further including:
    a second semiconductor die disposed over the first semiconductor die; and
    a third conductive via formed through the encapsulant and electrically connected to the second semiconductor die.

5. The semiconductor device of claim 1, wherein the first conductive via extends beyond a second surface of the encapsulant opposite the first surface of the encapsulant.

6. The semiconductor device of claim 1, further including a plurality of stacked semiconductor devices electrically connected through the first conductive via.

7. A semiconductor device, comprising:
    a first semiconductor die;
    an encapsulant deposited around the first semiconductor die and over a surface of the first semiconductor die;
    a first conductive via formed through the encapsulant and extending beyond a first surface of the encapsulant to expose a side surface of the first conductive via; and
    a second conductive via formed through the encapsulant over the first semiconductor die.

8. The semiconductor device of claim 7, further including a conductive layer formed over the encapsulant between the first conductive via and second conductive via.

9. The semiconductor device of claim 8, further including an insulating layer formed over the conductive layer and encapsulant.

10. The semiconductor device of claim 7, wherein the first conductive via further includes a seed layer extending beyond the first surface of the encapsulant.

11. The semiconductor device of claim 7, further including:
    a second semiconductor die disposed over the first semiconductor die; and
    a third conductive via formed through the encapsulant and electrically connected to the second semiconductor die.

12. The semiconductor device of claim 7, wherein the first conductive via extends beyond a second surface of the encapsulant opposite the first surface of the encapsulant.

13. The semiconductor device of claim 7, further including a plurality of stacked semiconductor devices electrically connected through the first conductive via.

14. A semiconductor device, comprising:
a first semiconductor die;
an encapsulant deposited over the first semiconductor die;
a first conductive via formed through the encapsulant and extending beyond a first surface of the encapsulant to expose a side surface of the first conductive via;
a conductive layer formed over the encapsulant and electrically connected to the first conductive via; and
an insulating layer formed over the conductive layer and encapsulant.

15. The semiconductor device of claim 14, further including a second conductive via formed through the encapsulant over the first semiconductor die.

16. The semiconductor device of claim 14, wherein the first conductive via further includes a seed layer extending beyond the first surface of the encapsulant.

17. The semiconductor device of claim 14, further including:
a second semiconductor die disposed over the first semiconductor die; and
a second conductive via formed through the encapsulant and electrically connected to the second semiconductor die.

18. The semiconductor device of claim 14, wherein the first conductive via extends beyond a second surface of the encapsulant opposite the first surface of the encapsulant.

19. The semiconductor device of claim 14, further including a plurality of stacked semiconductor devices electrically connected through the first conductive via.

20. A semiconductor device, comprising:
a first semiconductor die;
an encapsulant deposited around the first semiconductor die and over a surface of the first semiconductor die; and
a first conductive via formed through the encapsulant and extending beyond a first surface of the encapsulant to expose a side surface of the first conductive via.

21. The semiconductor device of claim 20, further including:
a second conductive via formed through the encapsulant over the first semiconductor die; and
a conductive layer formed over the encapsulant between the first conductive via and second conductive via.

22. The semiconductor device of claim 21, further including an insulating layer formed over the conductive layer and encapsulant.

23. The semiconductor device of claim 20, wherein the first conductive via further includes a seed layer extending beyond the first surface of the encapsulant.

24. The semiconductor device of claim 20, further including:
a second semiconductor die disposed over the first semiconductor die; and
a second conductive via formed through the encapsulant and electrically connected to the second semiconductor die.

25. The semiconductor device of claim 20, wherein the first conductive via extends beyond a second surface of the encapsulant opposite the first surface of the encapsulant.

* * * * *